(12) United States Patent
Garabedian et al.

(10) Patent No.: US 6,788,720 B2
(45) Date of Patent: Sep. 7, 2004

(54) SEMICONDUCTOR OPTICAL COMPONENT AND A METHOD OF FABRICATING IT

(75) Inventors: Patrick Garabedian, Breuillet (FR); Christian Brot, Leuville sur Orge (FR)

(73) Assignee: Avanex Corporation, Fremont, CA (US)

( * ) Notice: Subject to any disclaimer, the term of this patent is extended or adjusted under 35 U.S.C. 154(b) by 111 days.

(21) Appl. No.: 10/246,425

(22) Filed: Sep. 19, 2002

(65) Prior Publication Data

US 2003/0124756 A1 Jul. 3, 2003

(30) Foreign Application Priority Data

Sep. 20, 2001 (FR) .............................................. 01 12342

(51) Int. Cl.⁷ ............................ H01S 5/04; H01L 21/00
(52) U.S. Cl. .......................................... 372/44; 438/46
(58) Field of Search ............................... 372/39, 43–50; 438/22, 39, 45, 46, 47; 359/337, 344, 341.1, 345; 257/79

(56) References Cited

U.S. PATENT DOCUMENTS

| 5,426,658 A | 6/1995 | Hayafuji et al. |
| 5,504,768 A | 4/1996 | Yoo et al. |

FOREIGN PATENT DOCUMENTS

DE  198 13 180 A  10/1999

*Primary Examiner*—Evan Pert
(74) *Attorney, Agent, or Firm*—Moser, Patterson & Sheridan, L.L.P.

(57) ABSTRACT

A semiconductor optical component is disclosed which comprises a current injection region and at least one electrically isolated region referred to as a first plateau, each region containing a contact layer of an alloy based on gallium arsenide, GaAs, deposited on a semiconductor material upper confinement layer. The component further comprises in the first plateau a dielectric material isolation layer on top of the contact layer. An attachment layer is disposed between the contact layer and the isolation layer to increase the adhesion of the isolation layer to the contact layer. A method of fabricating the above kind of component is also disclosed.

18 Claims, 5 Drawing Sheets

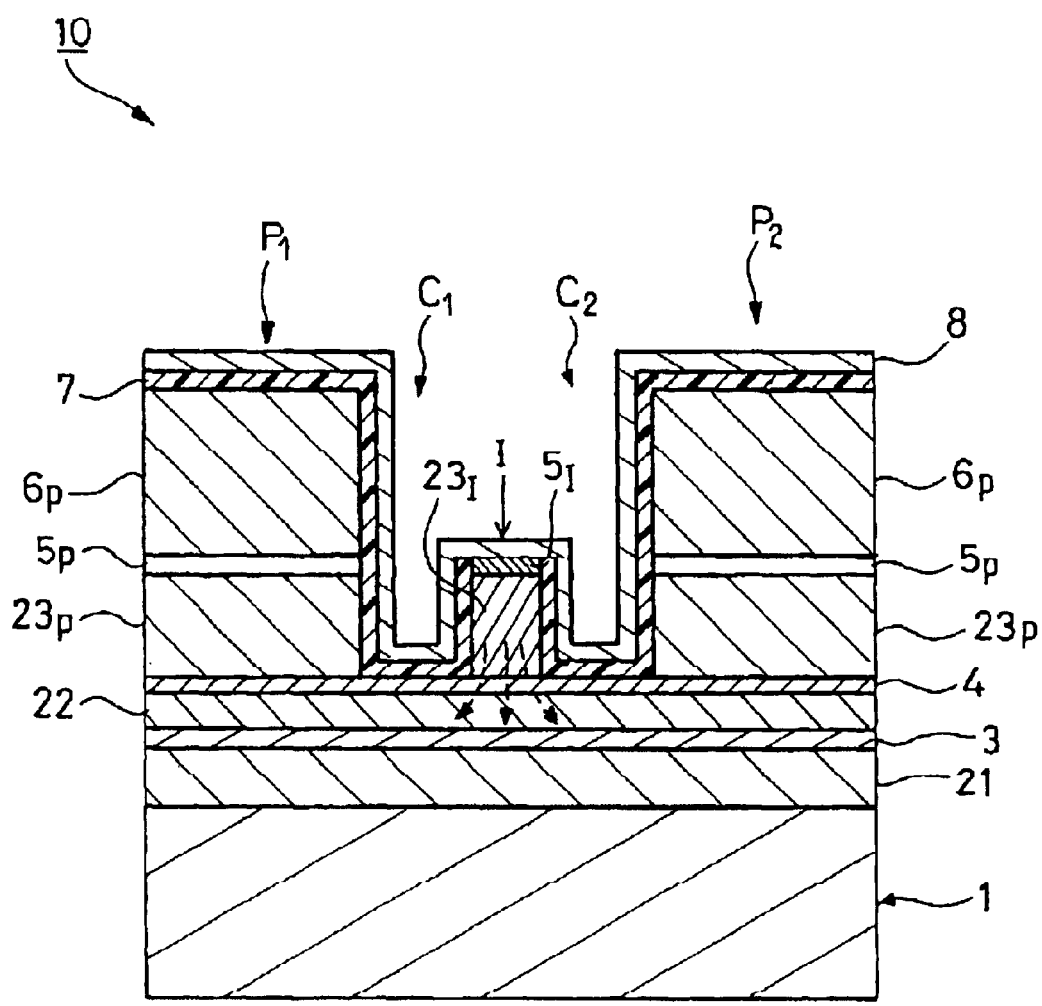
FIG_1

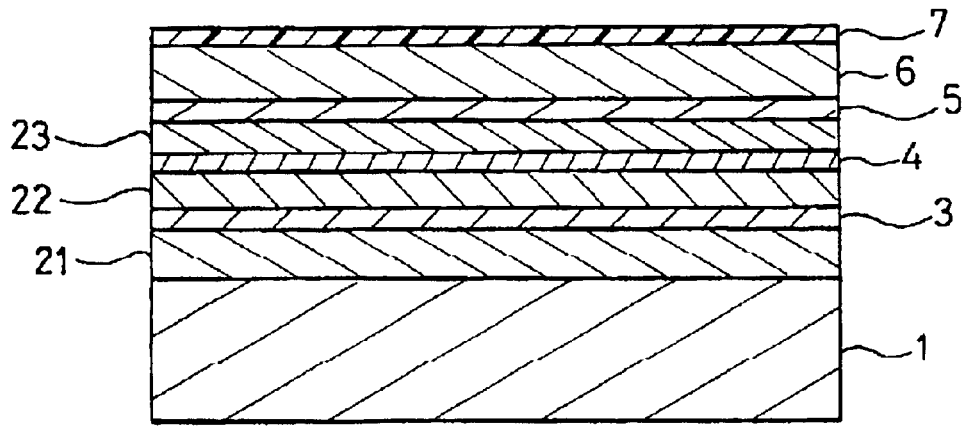
FIG_2
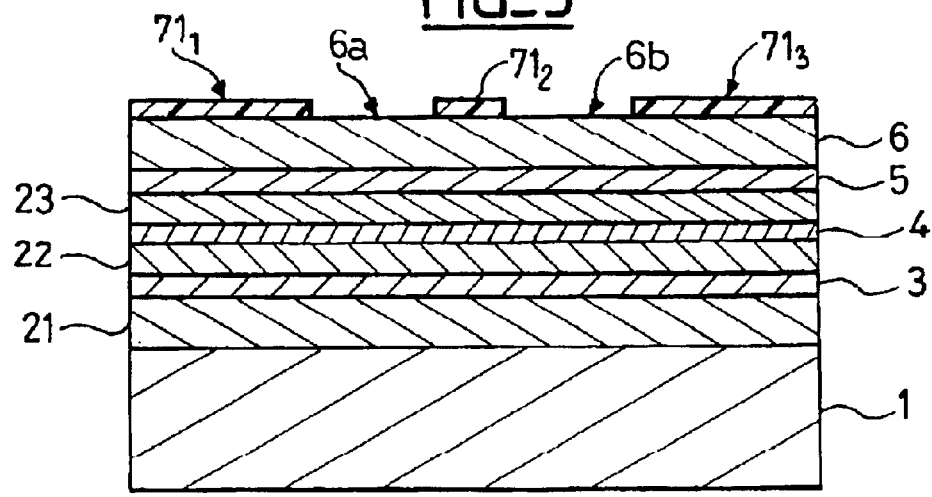
FIG_3
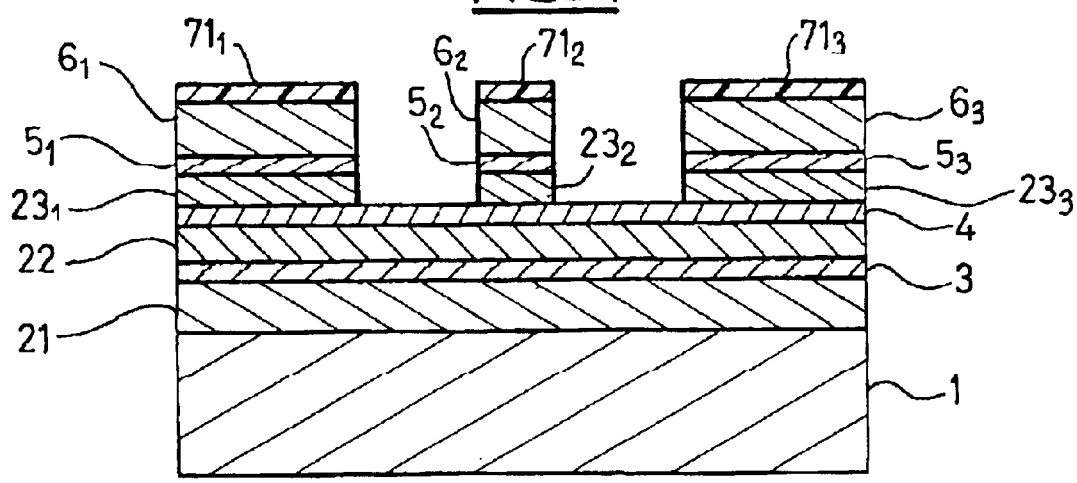
FIG_4

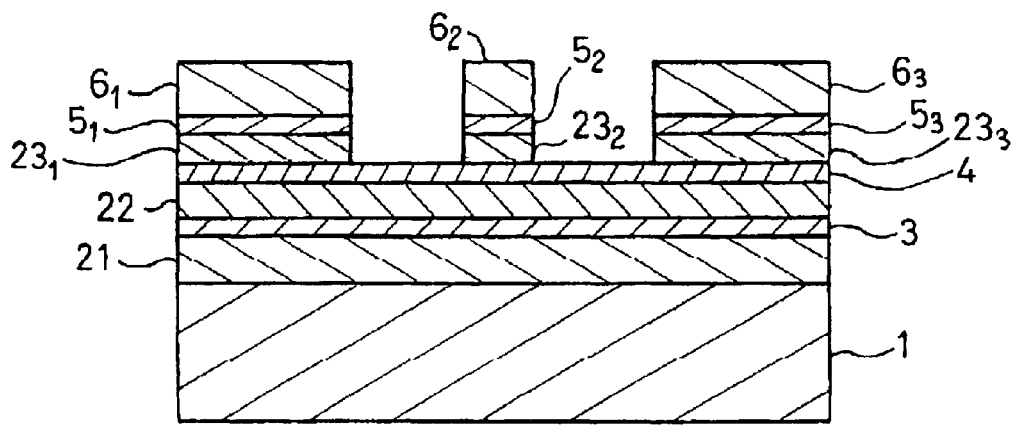
FIG_5
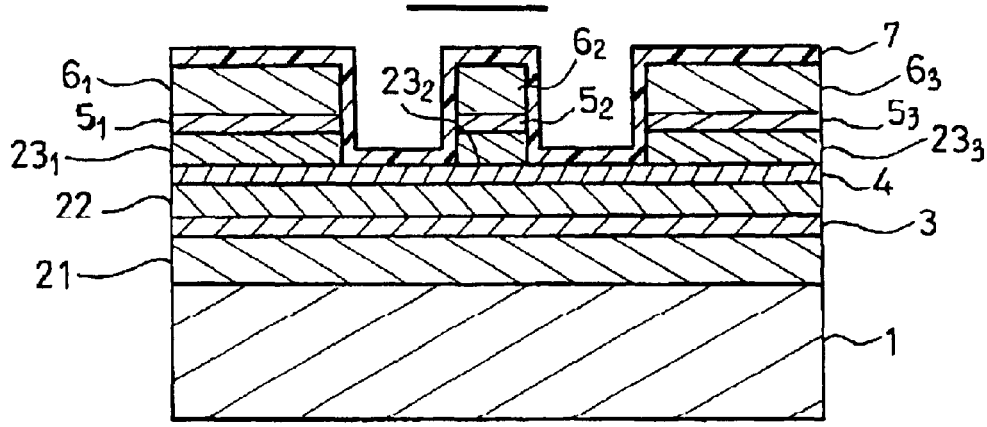
FIG_6
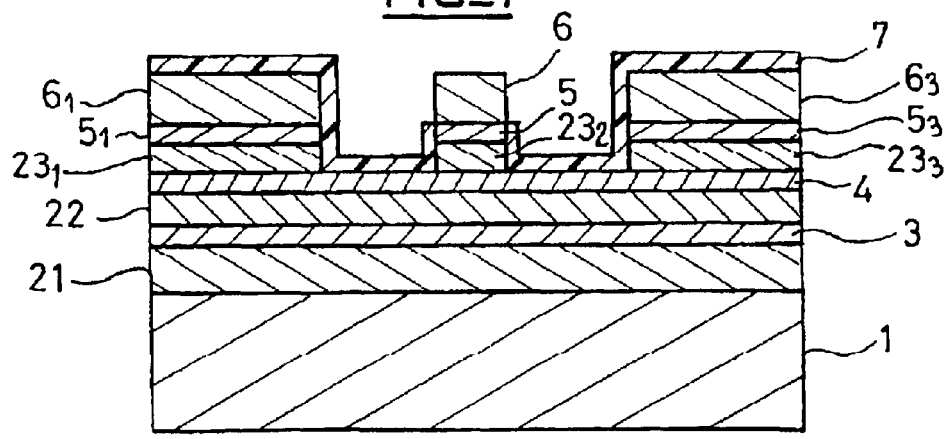
FIG_7

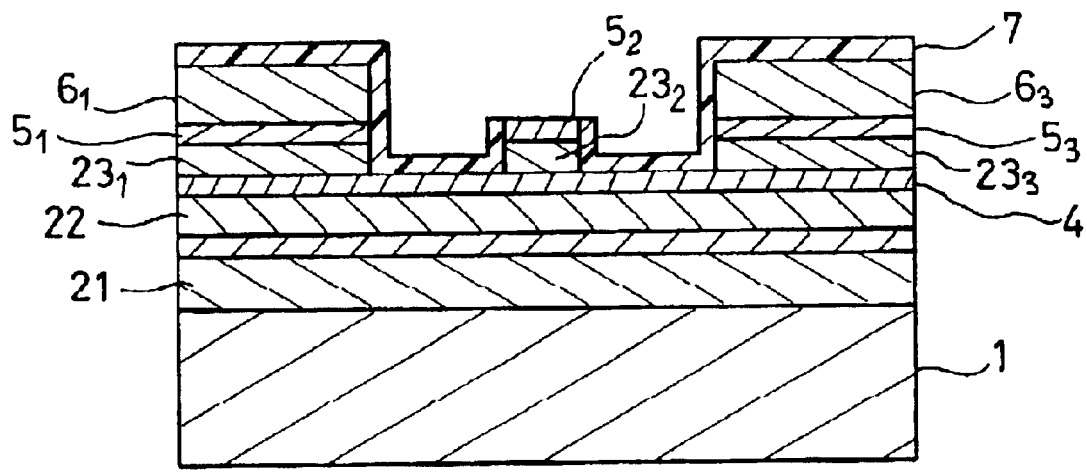
FIG_8
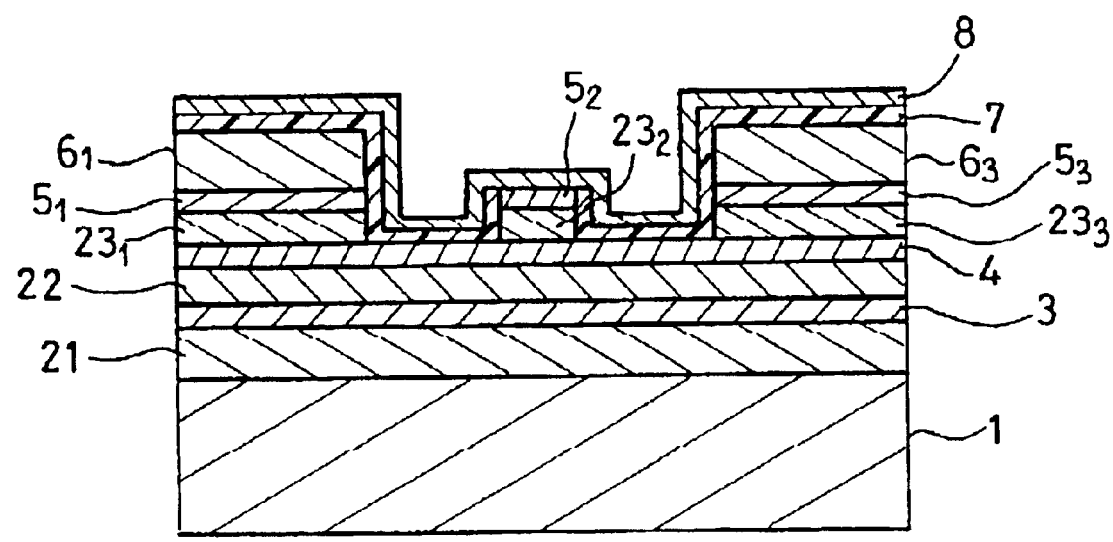
FIG_9

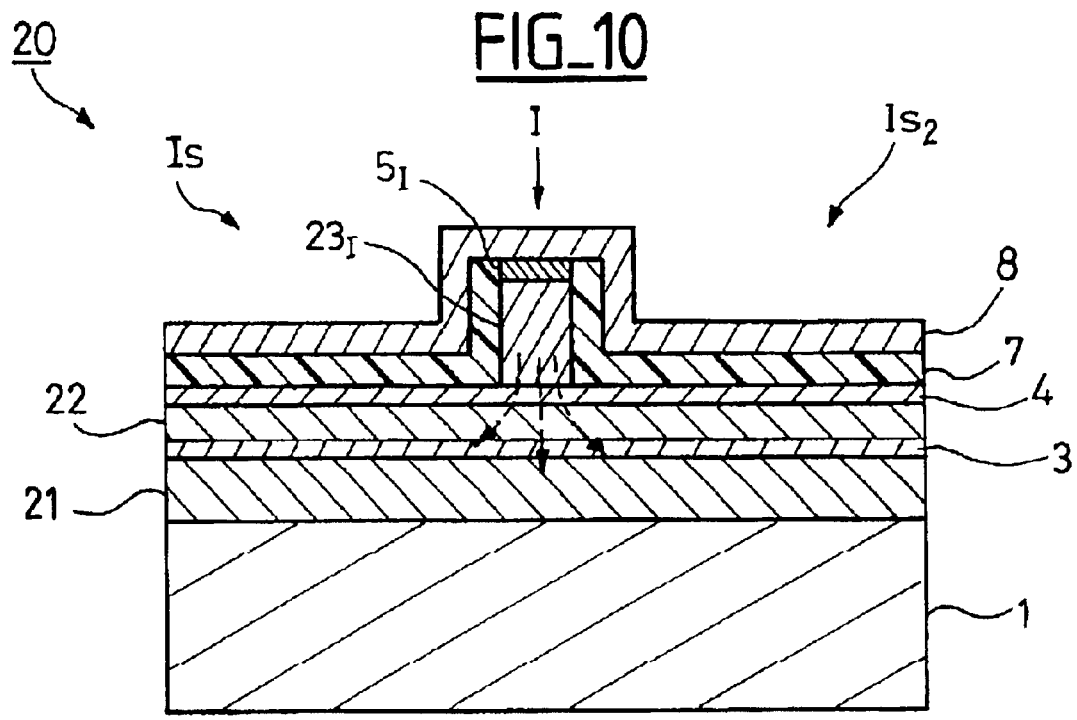
FIG_10
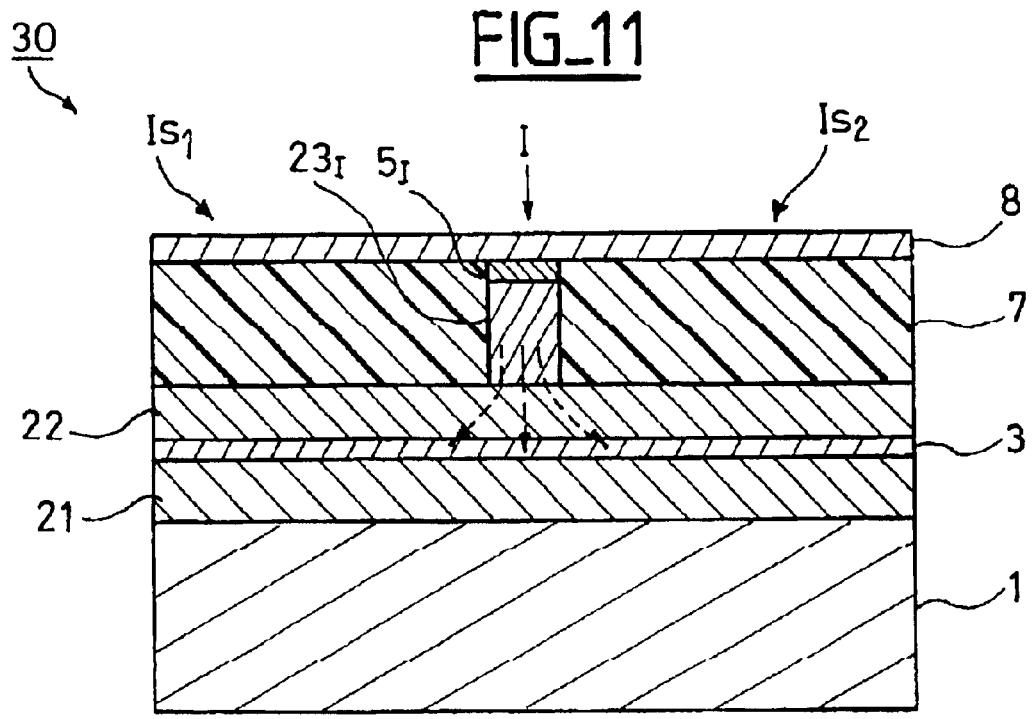
FIG_11

SEMICONDUCTOR OPTICAL COMPONENT AND A METHOD OF FABRICATING IT

BACKGROUND OF THE INVENTION

1. Field of the Invention

The present invention relates to optical components. To be more precise, it relates to a semiconductor optical component and a method of fabricating it.

2. Description of the Prior Art

A laser type semiconductor optical component based on gallium arsenide is often used to pump solid lasers or optical amplifiers employing fibers doped with rare earths. This is known in the art. The operation of the above kind of component is based on the use of an active layer which, once supplied with current, emits radiation that can be amplified and can correspond to laser radiation, at wavelengths generally within a band around 808 nm, 920 nm, 940 nm, and in particular 980 nm, this latter wavelength being used for pumping monomode fiber amplifiers employed in optical telecommunication applications. Moreover, the above optical component, which is often of the parallelepiped-shaped type, can have cleaved front and rear lateral faces to form faceted mirrors so that Fabry-Pérot longitudinal propagation modes are established in the component.

Throughout the following description, the term "layer" designates either a single layer or a stack of layers fulfilling the same function.

On top of the active layer, the semiconductor optical component generally comprises two electrically isolated regions which are called plateaux because of their shape, these plateaux being situated on respective opposite sides of a current injection region in which current penetrates to the interior of the component.

The plateaux and the current injection region each contain a contact layer for making ohmic contact in the current injection region, i.e. to achieve a good flow of current toward the active layer. The contact layer, which is generally made from an alloy based on gallium arsenide (GaAs), is deposited onto a upper confinement layer, which is made from a semiconductor material and contributes to guiding radiation emitted by the active layer.

The monocrystalline semiconductor material active layer, upper confinement layer and contact layer are generally deposited by metal organic vapor phase epitaxy (MOVPE) or molecular beam epitaxy (MBE).

The plateaux comprise an isolation layer made from a dielectric material such as a metal oxide (alumina, titanium oxide, etc.), a polyimide, and usually a silicon nitride, which is chosen for its excellent dielectric properties.

Because of the presence of the isolation layer, the height of the plateaux is significantly greater than the height of the current injection region. In this configuration, the plateaux therefore protect the current injection region from mechanical damage (knocks, scratches, etc.) occurring during fabrication and/or use of the component. This type of configuration is favored over projecting configurations, i.e. configurations with no plateau type electrically isolated region.

Moreover, there are also components with a current injection region disposed between two electrically isolated regions in the form of channels, situated on respective opposite sides of the current injection region. These channels are themselves disposed between two plateaux protecting the current injection region. The expression "double channel component" is then used.

The adhesion to the GaAs of the dielectric materials previously cited constituting the isolation layer is critical. Adhesion problems arise during the step of depositing the layer and/or after deposition, during subsequent component fabrication steps. This lack of adhesion frequently leads to unsticking of the isolation layer on the plateaux. This unsticking can in particular occur during heat treatment at high temperatures and/or during cleaving of the component. For example, during cleaving, the mechanical energy delivered to break the crystal becomes greater than the cohesion force between the isolation layer and the contact layer in the vicinity of the faceted mirrors. A larger or smaller gap is formed between the isolation layer and the contact layer in this case.

Adhesion defects and unsticking are liable to propagate as far as the edges of the current injection region. This introduces spreading of the current lines, surface current leaks widening the current injection region at the level of the active layer, which degrades the electro-optical properties of the component. Moreover, the possibility of unsticking reduces the reliability and the service life of the component.

A first object of the present invention is to develop a semiconductor optical component that offers reliability and good performance and overcomes the problems of adhesion and of unsticking of the isolation layer on the contact layer.

SUMMARY OF THE INVENTION

To this end the invention proposes a semiconductor optical component comprising a current injection region and at least one electrically isolated region referred to as a first plateau, each region containing a contact layer of an alloy based on gallium arsenide, GaAs, deposited on a semiconductor material upper confinement layer, the component further comprising in the first plateau a dielectric material isolation layer on top of the contact layer, and in which component an attachment layer is disposed between the contact layer and the isolation layer to increase the adhesion of the isolation layer to the contact layer.

An appropriate material is chosen for the attachment layer in order to favor adhesion of the isolation layer not only during deposition but also during subsequent component fabrication steps (heat treatment, cleaving, etc.).

Furthermore, preparation of the surface of the attachment layer before deposition can be envisaged, for example using a wet method employing a deoxidizing agent and/or a dry method that effects brief oxide removal. Similarly, the choice may be made to optimize the deposition conditions, for example by using the plasma enhanced chemical vapor deposition (PECVD) process employing a plasma containing high-energy ions. This kind of oxide removal and high-energy deposition of the isolation layer cannot be envisaged in the case of a prior art component. In effect, energetic ions bombarding the contact layer damage its surface.

The attachment layer according to the invention can advantageously be made from an alloy based on phosphorus and preferably from an alloy based on phosphorus, gallium and indium, such as $InGaP_2$.

In this way, the attachment layer can be deposited epitaxially at a high temperature and immediately after the contact layer, in the same epitaxial sequence and without returning the component to the open air. This does not necessitate any particular surface preparation of the contact layer as these layers have matching lattice parameters. Moreover, epitaxial deposition is carried out under conditions such that the surface of the contact layer is damaged during nucleation of the attachment layer.

Furthermore, unlike prior art methods, a deoxidizing agent such as a sulfuric acid can be used to prepare for deposition of the isolation layer without degrading the underlying contact layer.

The attachment layer according to the invention can advantageously have a thickness from 20 nm to 5000 nm and preferably of the order of 1000 nm.

A thickness of the order of 20 nm to 30 nm is sufficient to solve the adhesion problem. Nevertheless, the deposition of a thicker layer has another advantage. In effect, because the current injection region comprises no attachment layer, the thicker that layer the greater the height difference between the plateau or plateaux and the current injection region. Thus, with a deposit thickness of the order of 1000 nm, the current injection region is better protected from mechanical damage.

According to the invention, the isolation layer can be made from a dielectric material chosen from polyimides, metal oxides, silica, nitrides, and preferably from silicon nitrides.

Metal oxides such as alumina can be used. Silicon nitrides are materials based on nitrogen and silicon and can also contain a smaller quantity of oxygen and/or hydrogen. These nitrides are particularly recommended because of their excellent isolating properties and their ability to withstand heat treatment or etching during fabrication of the component.

In one embodiment of the invention, the optical component further comprises an electrically isolated region called the first channel between the first plateau and the current injection region.

In this embodiment, the optical component can further comprise a second plateau identical to the first plateau and a second channel identical to the first channel disposed between the second plateau and the current injection region, so that the first and second channels are situated on respective opposite sides of the current injection region.

Thus a component according to the invention can be a double-channel component.

According to the invention, the current injection region and the plateau or plateaux can be of substantially parallelepiped shape. Furthermore, the height of the current injection region can be significantly less than the height of the plateau or plateaux.

A parallelepiped shape is easily produced by etching and thus simplifies some steps of fabricating a component according to the invention.

The optical component according to the invention can further comprise a GaAs substrate onto the same face of which are successively deposited:

a semiconductor material lower confinement layer that is preferably similar to the material of the upper confinement layer, an active layer intended to produce laser type radiation, a semiconductor material intermediate confinement layer that is preferably similar to the material of the lower confinement layer, and an intermediate coverage layer of an alloy based on phosphorus, the upper confinement layer being deposited on the intermediate coverage layer, and the component can further comprise a metal electrode layer covering the electrically isolated region or regions and the current injection region.

In a prior art component, as in the component according to the invention, the electrode layer of the plateau or plateaux is deposited on the isolation layer. In a prior art component, the deposition of this layer induces biaxial stresses in the isolation layer, the effect of which is to increase the problem of adhesion to the contact layer. In the component according to the invention, the attachment layer disposed between the latter layers minimizes the consequences of these stresses. Thus it fulfils again its adhesion promoting role.

Moreover, the electrode layer necessitates heat treatment at high temperatures from 400° C. to 500° C. to form the ohmic contact. In the prior art, this heat treatment further degrades the adhesion of the isolation layer to the contact layer. In the component according to the invention, the attachment layer disposed between the latter layers increases the adhesion of the isolation layer to a surprising degree, rather than degrading it.

The adhesion was tested using a scratching test, which measures the decohesion force necessary to detach a silicon nitride isolation layer on a GaAs layer such as the contact layer and on an $InGaP_2$ layer such as the attachment layer according to the invention after heat treatment of the above kind at a high temperature. Regardless of the deoxidizing agent used before deposition and of the chosen deposition conditions, the decohesion force necessary with an $InGaP_2$ substrate is always several milliNewtons greater than that with a GaAs substrate.

Furthermore, the intermediate coverage layer can be used to adjust the height of the channels, where present, as in the prior art. The channels further comprise the isolation layer deposited on this intermediate layer.

Thus the alloy of the attachment layer can preferably be identical to the alloy of the intermediate coverage layer.

In this way, the isolation layer is deposited on the tops of the plateaux and in the channels, where present, on layers of the same alloy.

The present invention also relates to a method of fabricating a semiconductor optical component comprising a current injection region and a plurality of electrically isolated regions, possibly of greater height than the current injection region, in order to protect it from mechanical damage. These electrically isolated regions can comprise plateaux primarily made from dielectric materials or also with semiconductor layers. In the latter case, the plateaux are preferably associated with channels to form a double-channel structure. In another configuration, the electrically isolated regions can be recessed on respective opposite sides of the current injection region, which continues to project.

For all the above configurations, in a manner that is known in the art, a method of fabricating a semiconductor optical component of the above kind, often of the parallelepiped-shaped type, comprises firstly a series of successive depositions by the MOVPE or MBE process onto the same face of a GaAs substrate of:

an $Al_xGa_{1-x}As$ lower confinement layer, an active layer intended to produce laser type radiation and containing at least one quantum well between two GaAs layers, an $Al_yGa_{1-y}As$ intermediate confinement layer, an $Al_zGa_{1-z}As$ upper confinement layer, and a GaAs contact layer.

The method can equally comprise a step of depositing an intermediate coverage layer of $InGaP_2$ situated between the upper confinement layer and the intermediate confinement layer. This layer is primarily used to fabricate double-channel components.

The majority of the semiconductor layers situated above the active layer have p-type doping and, by symmetry, those below the active layer have n-type doping, like the substrate.

The doping corresponds to the deliberate addition of impurities which constitute electron donors in the case of n-type doping (conduction by electrons) or electron acceptors in the case of p-type doping (conduction by holes or positive charges).

Following the above depositions, a masking layer of a dielectric material is deposited on the GaAs contact layer, generally by the PECVD process. This layer provides a photolithography medium. The choice of a dielectric material of the silicon nitride $Si_3N_4$ type instead of a photosensitive resin for masking is often justified by the fact that the latter is less sensitive to the plasmas used afterwards for etching. In this way, the layers situated under the masking layer are better protected.

After masking, there therefore follows a dry etching step of the reactive ion etching (RIE) type, or a wet etching step using a chemical bath. This step partly eliminates the masking layer, for example in the regions intended to form the channels or the recessed regions. It is followed by another etching step for eliminating in these regions the contact layer and the underlying upper confinement layer, either by selective wet etching of the GaAs using sulfuric acid and oxygenated water, or by dry etching using plasmas containing chlorine.

Another, demasking, etching step eliminates the masking layer entirely, generally by wet etching using dilute hydrofluoric acid or by a low-energy fluorine chemistry plasma process.

Then, an isolation layer of dielectric material of the polyimide type or preferably of $Si_3N_4$ is deposited by the PECVD process to cover all of the regions. The deposit is more or less thick according to the required configuration of the component, and the thickness can be less than or greater than the height prior to deposition of the portion intended to form the current injection region.

A subsequent opening step eliminates at least the part of the isolation layer intended to form the current injection region, and where applicable in some electrically isolated regions, to flatten the surface of the component and/or simply to reduce the thickness of the isolation layer in order to reduce the height of these regions. This opening step is preferably effected by a dry process.

A subsequent metallization step consists in depositing an electrode layer generally comprising a metal multilayer of the Ti/Pt/Au type. This electrode layer covers all the regions and provides ohmic contact with gold current feeder wires welded by thermo-compression. This metallization step comprises heat treatment after deposition at high temperature.

Moreover, the process then comprises a step of cleaving the front and rear lateral faces of the component.

A first problem encountered in the prior art fabrication process described hereinabove concerns the adhesion to the GaAs of dielectric materials such as $Si_3N_4$. This lack of adhesion frequently leads to unsticking of the masking layer and/or of the isolation layer.

A second problem encountered in a process of the above kind concerns an abnormal increase in the series-connected electrical resistances of each semiconductor layer and of the interfaces of the current injection region, primarily the p-doped GaAs contact layer.

This increase can result from the degraded quality of the surface of the contact layer, caused by the various dry etching steps and by the deposition of the dielectric layers onto the contact layer by the PECVD process. In effect, these deposition and etching operations are effected with plasmas containing very high energy ions which, by bombarding it, damage the GaAs contact layer by inducing crystal defects (lattice distortion, lacunae, interstices, etc.). These defects are associated with n-type electrical levels, and are not favorable to obtaining a p-type ohmic contact. This competition between an n-type form of doping and the initial p-type doping increases the electrical resistance of the contact layer/electrode layer interface. Moreover, during these deposition operations, atomic hydrogen accelerated by the plasma onto the surface of the contact layer has sufficient energy to diffuse into the mass of the semiconductor contact layer and to form n-type H-doping complexes passivating the electrical contribution of the p-type charge carriers of the layer.

Another cause of increased resistance is attributed to the surface reactivity of the contact layer with basic oxide removal solutions used to remove the photolithography masks or some solutions used to deoxidize the surfaces, such as sulfuric acid, which reactivity favors the adhesion to the intermediate coverage layer made from a phosphorus-based alloy before depositing the isolation layer. These solutions first attack the surface of the semiconductor contact layer and, when rinsing with water, this attack propagates into the mass of the contact layer.

Thus a second object of the present invention is to provide a method of fabricating a semiconductor optical component having a current injection region and one or more electrically isolated regions, which method is easy to implement and guarantees the performance of the component obtained by eliminating problems of adhesion and increased resistance.

To this end, the invention proposes a method of fabricating a semiconductor optical component comprising a current injection region and at least one electrically isolated region, the method including the following steps:

a step of depositing a contact layer of an alloy based on GaAs on a semiconductor material upper confinement layer, and a subsequent step of depositing a masking layer of a silicon nitride type dielectric material on the contact layer, which method further includes an intermediate step of depositing an attachment layer between the contact layer and the masking layer to increase the adhesion of the masking layer to the contact layer.

An appropriate material is chosen for the attachment layer in order to favor the adhesion of the masking layer not only during deposition but also during subsequent component fabrication steps.

Before depositing the masking layer, surface preparation of the attachment layer can be envisaged, for example by a wet method using a deoxidizing agent and/or by a dry method involving brief oxide removal. Similarly, a choice can be made to optimize the deposition conditions, for example by using high-energy deposition.

As previously indicated, in a prior art method high-energy deposition of the masking layer by the PECVD process damages the contact layer. The invention solves this problem by interposing the attachment layer.

The attachment layer can advantageously be made from a phosphorus-based alloy, and preferably from an alloy based on phosphorus, gallium and indium, such as $InGaP_2$.

In this way, the attachment layer can also be deposited epitaxially, immediately after depositing the contact layer and without removing the component from the epitaxy reactor. This requires no particular surface preparation of the contact layer as these layers have matching lattice parameters. Also, epitaxial deposition is carried out under conditions such that the surface of the contact layer is not damaged during nucleation. In the same way, there is no hydrogenation of the contact layer during this deposition because epitaxial deposition is effected at a high temperature, which favors exodiffusion of the hydrogen, which is furthermore not accelerated by the presence of an electromagnetic field as when using a PECVD type process.

Furthermore, a deoxidizing agent such as a sulfuric acid can be used to prepare for deposition of the isolation layer without degrading the contact layer.

The fabrication method according to the invention can further include, before depositing the upper confinement layer, the following successive steps of deposition on the same face of a GaAs type substrate:

a lower confinement layer of a semiconductor material that is preferably similar to the material of the upper confinement layer, an active layer intended to produce laser type radiation, and an intermediate confinement layer of a semiconductor material that is preferably similar to the material of the lower confinement layer.

The method according to the invention can further include, after depositing the intermediate confinement layer, a step of depositing a intermediate coverage layer of a phosphorus-based alloy, the upper confinement layer being deposited on the intermediate coverage layer.

In the case of components with a projecting current injection region, the intermediate coverage layer defines the stopping point of the etching of the recessed electrically isolated regions situated on respective opposite sides and, in the case of double-channel components, adjusts the height of the channels. This adjusts the thickness of the upper confinement layer on respective opposite sides of the current injection region. In conjunction with the width of the current injection region and the compositions of the confinement layers and the active layer, the choice of this thickness contributes to defining the guidance properties of the component.

The method according to the invention can further include the following steps after depositing the masking layer:

a step of partial elimination of the masking layer to expose partially the attachment layer, a subsequent etching step to eliminate portions of the attachment layer exposed by the partial elimination step, the underlying contact layer, and the underlying upper confinement layer, a subsequent step of depositing an isolation layer of a silicon nitride type dielectric material, and a subsequent opening step for eliminating the isolation layer at least in portions in which the attachment layer intended to form the current injection region is still present.

The step of partial elimination of the masking layer using photolithography leaves exposed one or more portions of the attachment layer, not the contact layer, as in the prior art. After this step the harmful prior art oxide removal solutions already cited are used. In the method according to the invention, the attachment layer, being less sensitive to these solutions, protects the contact layer.

During the subsequent etching step, it is possible to start high-energy chlorinated plasma etching in order to remove the attachment layer and then to continue at a low energy, which is sufficient to remove the contact layer based on GaAs and the upper confinement layer, often based on $Al_xGa_{1-x}As$. In this way, the phosphorus-based intermediate coverage layer can define where the etching stops.

Moreover, in the portion intended to form the current injection region, the isolation layer is deposited on the attachment layer so that the surface of the contact layer is also protected from bombardment with ions during the deposition of the isolation layer, and in the same way there is no hydrogenation in the contact layer, in particular during the epitaxial deposition of the attachment layer based on phosphorus, gallium and indium. Thus the adhesion of the isolation layer can be optimized in the same way as that of the masking layer.

Moreover, in double-channel components or in components with a projecting current injection region, the parts intended to form the channels or the recessed electrically isolated regions include the isolation layer that can be deposited onto a phosphorus-based intermediate layer. Thus the adhesion of the isolation layer is also controlled in these regions.

The method according to the invention can further include another, demasking, etching step between the etching step and the step of depositing an isolation layer to eliminate the masking layer completely.

In particular, this avoids unnecessary overthickness of the dielectric material layers.

The method according to the invention can further include, after the opening step, an oxide removal step to eliminate the attachment layer in the portion intended to form the current injection region.

The attachment layer according to the invention can be made from a phosphorus-based alloy which has a wide forbidden band. The forbidden band corresponds to the energy difference between the lowermost point of the conduction band and the uppermost point of the valency band. It is important in this kind of situation to eliminate this layer in the portion intended to form the current injection region. In effect, the ohmic contact with the active layer and the underlying confinement layers is broken because of this wide forbidden band, because the semiconductor alloy with a wide forbidden band does not favor obtaining a metal/semiconductor interface of the ohmic type with a low electrical contact resistivity.

This oxide removal step can be carried out wet, for example using a bath of dilute hydrochloric acid. Photolithography is not needed because the isolation layer protects all of the other regions and therefore serves as an etching mask. Moreover, this kind of acid does not contaminate the GaAs contact layer in the current injection region.

The method according to the invention can further include, after the oxide removal step, a metallization step comprising the deposition of a metal electrode layer to cover the electrically isolated region or regions and the current injection region.

In the prior art, the deposition of this layer induces biaxial stresses in the isolation layer, the effect of which is to increase the problems of adhesion to the contact layer. In the method according to the invention the attachment layer disposed between the latter layers minimizes the consequences for adhesion of these stresses. It therefore again fulfils its adhesion promotion role.

A semiconductor optical component obtained by a fabrication method according to the invention can have two electrically isolated regions disposed on respective opposite sides of the current injection region, such as the recessed regions previously defined.

The features and objects of the present invention will emerge from the following detailed description, which is given with reference to the accompanying drawings, which are provided by way of illustrative example and are in no way limiting on the invention.

BRIEF DESCRIPTION OF THE DRAWINGS

FIG. 1 is a diagrammatic view in section of a semiconductor optical component according to the invention.

FIGS. 2 to 9 represent the steps of a method according to the invention of fabricating a semiconductor optical component.

FIG. 10 is a diagrammatic view in section of a semiconductor optical component according to the invention obtained by a fabrication method according to the invention.

FIG. 11 is a diagrammatic view in section of a variant semiconductor optical component according to the invention obtained by a fabrication method according to the invention.

DETAILED DESCRIPTION OF THE PREFERRED EMBODIMENTS

Common items, i.e. items with the same function, are designated by the same reference number in all the figures.

FIG. 1 shows a diagrammatic view in section of a semiconductor optical component 10 according to the invention, used as an optical fiber pumping source.

The component 10 has an n-type doped GaAs substrate 1 on which are deposited by MOVPE or MBE:

an n-type doped lower confinement layer 21 which is formed of a varying composition $Al_xGa_{1-x}As$ multilayer (x varying from 0.45 to 0.18) having a total thickness of the order of 2 $\mu$m, an active layer 3 between two GaAs layers and which is formed of $In_xGaAs$ (the value of x being of the order of 0.15), intended to produce laser type radiation and containing at least one quantum well, a p-type doped intermediate confinement layer 22 which is formed of a variable composition $Al_xGa_{1-x}As$ multilayer (x varying from 0.18 to 0.45) having a total thickness of the order of 0.6 $\mu$m, and a p-type doped intermediate coverage area 4 which is formed of $InGaP_2$ and has a thickness of the order of 0.02 $\mu$m and a forbidden band which is identical to that of $Al_{0.45}Ga_{0.55}As$, in order not to introduce any index jump into the structure and thus not to modify the guidance properties of the component 10.

To favor the growth of subsequent layers, the substrate 1 can further comprise a buffer layer (not shown) of epitaxially grown GaAs a few tens of microns thick, for example.

The parallelepiped-shaped component 10 operates with a current injection region I of the order of 2 $\mu$m wide disposed between two channels referred to as the first channel $C_1$ and the second channel $C_2$, themselves disposed between plateau regions, referred to as the first plateau $P_1$ and the second plateau $P_2$. These regions I, $P_1$, $P_2$, $C_1$ and $C_2$ are situated on top of the layer 4 which determines where the etching to form the first and second channels $C_1$ and $C_2$ stops. The first and second channels $C_1$ and $C_2$ are a few tens of microns wide and delimit the localization of the current intended to feed the active layer 3, as shown by the dashed line arrows F. The first and second plateaux $P_1$, $P_2$ are approximately 100 $\mu$m wide and protect the current injection region I from mechanical damage.

The first and second plateaux $P_1$, $P_2$ and the current injection region I each comprise a respective p-type doped upper confinement layer $23_p$ and $23_I$ formed of a continuously varying composition multilayer of $AlxGa1-xAs$ (x varying from 0.45 to 0.18) deposited on the layer 4 and having a total thickness of the order of 1.5 $\mu$m. A p-type doped GaAs contact layer $5_p$ and $5_I$ with a thickness of the order of 0.05 $\mu$m is deposited on this layer.

According to the invention, the layer $5_p$ of the first and second plateaux $P_1$, $P_2$ is covered with an $InGaP_2$ attachment layer $6_p$ having a thickness of the order of 1 $\mu$m. The attachment layer $6_p$ increases the adhesion to the contact layer $5_p$ of a silicon nitride isolation layer 7 deposited by the PECVD process and having a thickness of the order of 0.2 $\mu$m.

In the first and second channels $C_1$, $C_2$ the isolation layer 7 is deposited on the $InGaP_2$ intermediate coverage layer 4. In this way, the attachment of this layer 7 can be optimized at the top of the plateau regions $P_1$ and $P_2$ and in the channel regions $C_1$, $C_2$.

Finally, the whole of the component is covered with a metal electrode layer 8 typically formed of a Ti, Pt or $T_iN$ and Au type multilayer having a thickness of the order of 0.5 $\mu$m. This electrode layer 8 makes ohmic contact with gold current feeder wires (not shown) welded by thermocompression.

FIGS. 2 to 9 represent the steps of a method according to the invention of fabricating a semiconductor optical component, for example a parallelepiped-shaped component, operating with a current injection region disposed between two channels, in turn disposed between two plateaux.

FIG. 2 shows the component obtained after a series of successive depositions by an MOVPE or MBE process on the same face of an n-type doped GaAs substrate 1:

deposition of an n-type doped lower confinement layer 21 of $Al_xGa_{1-x}As$, deposition of an active layer 3 between two GaAs layers intended to produce laser type radiation and containing a quantum well, deposition of a p-type doped intermediate confinement layer 22 of $Al_yGa_{1-y}As$, deposition of a p-type doped intermediate coverage layer 4 of $InGaP_2$, deposition of a p-type doped upper confinement layer 23 of $Al_zGa_{1-z}As$, deposition of a p-type doped contact layer 5 of GaAs, and deposition of an $InGaP_2$ attachment layer 6.

The attachment layer 6 increases the adhesion to the contact layer 5 of a silicon nitride masking layer 71 having a thickness of the order of 0.2 $\mu$m and deposited by the PECVD process. The layer 71 serves as a photolithography medium.

FIG. 3 shows the result of the step of partial elimination of the masking layer 71 to expose two portions 6a and 6b of the attachment layer. The layer 71 is then divided into three parts $71_1$, $71_2$ and $71_3$ for the double-channel component to be obtained.

FIG. 4 shows the result of the subsequent etching step for eliminating the underlying contact layer 5 and upper confinement layer 23 in the two exposed parts 6a and 6b of the attachment layer 6. The layers 23, 5 and 6 are then respectively divided into three layers $23_1$, $23_2$ and $23_3$, $5_1$, $5_2$ and $5_3$ and $6_1$, $6_2$ and $6_3$. The part containing the layers $23_2$ to $71_2$ is intended to form the current injection region. The layers $23_1$ to $71_1$ and $23_3$ to $71_3$ are contained in two parts intended to form two plateaux separated by two channels of the current injection region.

FIG. 5 shows the result of a subsequent demasking etching step for eliminating the whole of the masking layer 71.

FIG. 6 shows the result of a subsequent step of depositing a isolation layer 7 of a silicon nitride type dielectric material.

FIG. 7 shows the result of a subsequent opening step for eliminating the isolation layer 7 in the portion intended to form the current injection region.

FIG. 8 shows the result of a subsequent oxide removal step, often carried out chemically, for eliminating the attachment layer $6_2$ situated on the contact layer $5_2$ in the portion intended to form the current injection region.

FIG. 9 shows the result of a subsequent, so-called metallization step comprising the deposition of a metal electrode layer 8 covering all the regions.

A component of the FIG. 1 type is obtained in this way.

FIG. 10 is a diagrammatic view in section of a semiconductor optical component 20 according to the invention also obtained by a fabrication method according to the invention as described with reference to FIGS. 2 to 9. The component 20 comprises a current injection region I and on respective opposite sides thereof two electrically isolated regions $Is_1$, $Is_2$ from which the region I projects.

The partial elimination step shown in FIG. 3 leaves a single masking layer $71_2$ in the component 20.

FIG. 11 is a diagrammatic view in section of another semiconductor optical component 30 according to the invention obtained by a fabrication method according to the invention as described with reference to FIGS. 2 to 9. The component 30 comprises a current injection region I and on respective opposite sides thereof two electrically isolated regions $Is_1$, $IS_2$ the same height as the region I.

In the case of the component 30, the series of depositions shown in FIG. 2 does not include the deposition of an intermediate coverage layer.

The partial elimination step shown in FIG. 3 leaves a single masking layer $71_2$ in the component 30.

Furthermore, the deposited isolation layer 7 shown in FIG. 6 is thicker so that the height of the portions intended to form the electrically isolated regions $Is_1$, $Is_2$ is identical after this deposition to the height of the portion intended to form the current injection region I.

The embodiments shown herein are transverse monomode lasers. The invention applies equally to lasers in which the propagation of light is of the transverse multimode type and in which the upper confinement layer and the contact layer are not etched, such as wide contact lasers or multiribbon power laser strips. In effect, in these latter applications, the component also includes electrically isolated regions disposed between a current injection region and current injection is also localized by an isolation layer that is advantageously deposited on an attachment layer according to the invention.

There is claimed:

1. A semiconductor optical component comprising a current injection region and at least one electrically isolated region referred to as a first plateau, each region containing a contact layer of an alloy based on gallium arsenide, GaAs, deposited on a semiconductor material upper confinement layer, said component further comprising in said first plateau a dielectric material isolation layer on top of said contact layer, and in which component an attachment layer is disposed between said contact layer and said isolation layer to increase the adhesion of said isolation layer to said contact layer.

2. The semiconductor optical component claimed in claim 1 wherein said attachment layer is a layer of an alloy based on phosphorus, preferably an alloy based on phosphorus, gallium and indium.

3. The semiconductor optical component claimed in claim 1 wherein said attachment layer has a thickness from 20 nm to 5000 nm and preferably of the order of 1000 nm.

4. The semiconductor optical component claimed in claim 1 wherein said isolation layer is a layer of a dielectric material chosen from polyimides, metal oxides, silica and nitrides, and preferably from silicon nitrides.

5. The semiconductor optical component claimed in claim 1 further comprising an electrically isolated region referred to as the first channel between said first plateau and said current injection region.

6. The semiconductor optical component claimed in claim 5 further comprising a second plateau identical to said first plateau and a second channel identical to said first channel disposed between said second plateau and said current injection region so that said first and second channels are situated on respective opposite sides of said current injection region.

7. The semiconductor optical component claimed in claim 1 wherein said current injection region and said plateau is or said plateaux are substantially parallelepiped-shaped, the height of said current injection region being significantly less than said height of said plateau or plateaux.

8. The semiconductor optical component claimed in claim 1 further comprising a GaAs substrate onto the same face of which are successively deposited:

a semiconductor material lower confinement layer that is preferably similar to said material of said upper confinement layer, an active layer intended to produce laser type radiation, a semiconductor material intermediate confinement layer that is preferably similar to said material of said lower confinement layer, and an intermediate coverage layer of an alloy based on phosphorus, said upper confinement layer being deposited on said intermediate coverage layer, and which component further comprises a metal electrode layer covering said electrically isolated region or regions and said current injection region.

9. The semiconductor optical component claimed in claim 8 wherein said alloy of said attachment layer is identical to said alloy of said intermediate coverage layer.

10. A method of fabricating a semiconductor optical component comprising a current injection region and at least one electrically isolated region, said method including the following steps:

a step of depositing a contact layer of an alloy based on GaAs on a semiconductor material upper confinement layer, and a subsequent step of depositing a masking layer of a silicon nitride type dielectric material on said contact layer, which method further includes an intermediate step of depositing an attachment layer between said contact layer and said masking layer to increase the adhesion of said masking layer to said contact layer.

11. The fabrication method claimed in claim 10 wherein said attachment layer is a layer of an alloy based on phosphorus, preferably an alloy based on phosphorus, gallium and indium.

12. The fabrication method claimed in claim 10 further including, prior to the deposition of said upper confinement layer, successively depositing on the same face of a GaAs substrate:

a lower confinement layer of a semiconductor material that is preferably similar to said material of said upper confinement layer, an active layer intended to produce laser type radiation, and an intermediate confinement layer of a semiconductor material that is preferably similar to said material of said lower confinement layer.

13. The fabrication method claimed in claim 12 further including, after the deposition of said intermediate confinement layer, a step of depositing an intermediate coverage layer of an alloy based on phosphorus, said upper confinement layer being deposited on said intermediate coverage layer.

14. The fabrication method claimed in claim 10 further including the following steps after the deposition of said masking layer:
- a step of partial elimination of said masking layer to expose partially said attachment layer,
- a subsequent etching step to eliminate portions of said attachment layer exposed by said partial elimination step, the underlying contact layer, and the underlying upper confinement layer,
- a subsequent step of depositing an isolation layer of a silicon nitride type dielectric material, and
- a subsequent opening step for eliminating said isolation layer at least in portions in which said attachment layer intended to form said current injection region is still present.

15. The fabrication method claimed in claim 14 further including, between said etching step and said step of depositing an isolation layer, another, demasking etching step to eliminate said masking layer entirely.

16. The fabrication method claimed in claim 14 further including, after said opening step, an oxide removal step for eliminating said attachment layer in said portion intended to form said current injection region.

17. The fabrication method claimed in claim 16 further including, after said oxide removal step, a metalization step comprising the deposition of a metal electrode layer to cover said electrically isolated region or regions and said current injection region.

18. The semiconductor optical component obtained by a fabrication method as claimed in claim 10 wherein two electrically isolated regions are disposed on respective opposite sides of said current injection region.

* * * * *